United States Patent
Kumura (10) Patent No.: US 9,691,457 B2
(45) Date of Patent: Jun. 27, 2017

(54) MAGNETIC MEMORY DEVICE

(71) Applicant: Yoshinori Kumura, Seoul (KR)

(72) Inventor: Yoshinori Kumura, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/981,627

(22) Filed: Dec. 28, 2015

(65) Prior Publication Data

US 2016/0379696 A1 Dec. 29, 2016

Related U.S. Application Data

(60) Provisional application No. 62/185,318, filed on Jun. 26, 2015.

(51) Int. Cl.
| | | |
|---|---|---|
| *G11C 11/16* | (2006.01) | |
| *H01L 43/08* | (2006.01) | |
| *H01L 43/10* | (2006.01) | |
| *H01L 43/02* | (2006.01) | |

(52) U.S. Cl.
CPC ............ *G11C 11/161* (2013.01); *H01L 43/02* (2013.01); *H01L 43/08* (2013.01); *H01L 43/10* (2013.01)

(58) Field of Classification Search
CPC ......... H01L 43/12; H01L 43/08; H01L 43/10; H01L 27/228; H01L 29/82; G11C 11/161; H01F 10/126; H01F 10/3286; H01F 41/303; B82Y 40/00
USPC ....................................... 257/421, 427; 438/3
See application file for complete search history.

(56) References Cited

U.S. PATENT DOCUMENTS

| | | | |
|---|---|---|---|
| 5,866,930 A | * | 2/1999 | Saida ................ H01L 21/28035 257/316 |
| 7,495,870 B2 | | 2/2009 | Yuasa et al. |
| 8,372,661 B2 | | 2/2013 | Horng et al. |
| 2013/0069182 A1 | * | 3/2013 | Ohsawa ................... H01L 29/82 257/421 |
| 2014/0087485 A1 | * | 3/2014 | Tomioka ................. H01L 43/12 438/3 |
| 2015/0162525 A1 | * | 6/2015 | Park ........................ H01L 43/08 257/421 |
| 2015/0303372 A1 | * | 10/2015 | Meade .................... H01L 43/02 257/421 |

FOREIGN PATENT DOCUMENTS

JP 2013187305 A 9/2013

OTHER PUBLICATIONS

Takashi Sato, "Properties and Application of Amorphous Metals", Fundamental Research Labs. Nippon Steel Corp., Jitsumu Hyomen Gijutsu, vol. 28, No. 11, Oct. 30, 2009, pp. 556-562.

* cited by examiner

*Primary Examiner* — Benjamin Sandvik
*Assistant Examiner* — Changhyun Yi
(74) *Attorney, Agent, or Firm* — Holtz, Holtz & Volek PC (57) ABSTRACT

According to one embodiment, a magnetic memory device includes a magnetoresistive effect element, and a first layer provided on the magnetoresistive effect element, wherein the first layer includes an upper conductive layer, and a predetermined metal containing conductive layer provided between the magnetoresistive effect element and the upper conductive layer and containing a predetermined metal selected from Pt, Ir, Pd and Au.

7 Claims, 6 Drawing Sheets

MAGNETIC MEMORY DEVICE

CROSS-REFERENCE TO RELATED APPLICATIONS

This application claims the benefit of U.S. Provisional Application No. 62/185,318, filed Jun. 26, 2015, the entire contents of which are incorporated herein by reference.

FIELD

Embodiments described herein relate generally to a magnetic memory device.

BACKGROUND

A magnetic memory device (semiconductor integrated circuit device) in which a magnetoresistive effect element and a transistor are integrated on the same semiconductor substrate is proposed. In such a magnetic memory device, a cap layer is generally provided on the magnetoresistive effect element.

Conventionally, however, a magnetic memory device equipped with a sufficiently reliable cap layer has not been necessarily achieved.

DETAILED DESCRIPTION

In general, according to one embodiment, a magnetic memory device includes: a magnetoresistive effect element; and a first layer provided on the magnetoresistive effect element, wherein the first layer includes: an upper conductive layer; and a predetermined metal containing conductive layer provided between the magnetoresistive effect element and the upper conductive layer and containing a predetermined metal selected from Pt, Ir, Pd and Au.

Various embodiments will be described hereinafter with reference to the accompanying drawings.

Embodiment 1

Figure 1:
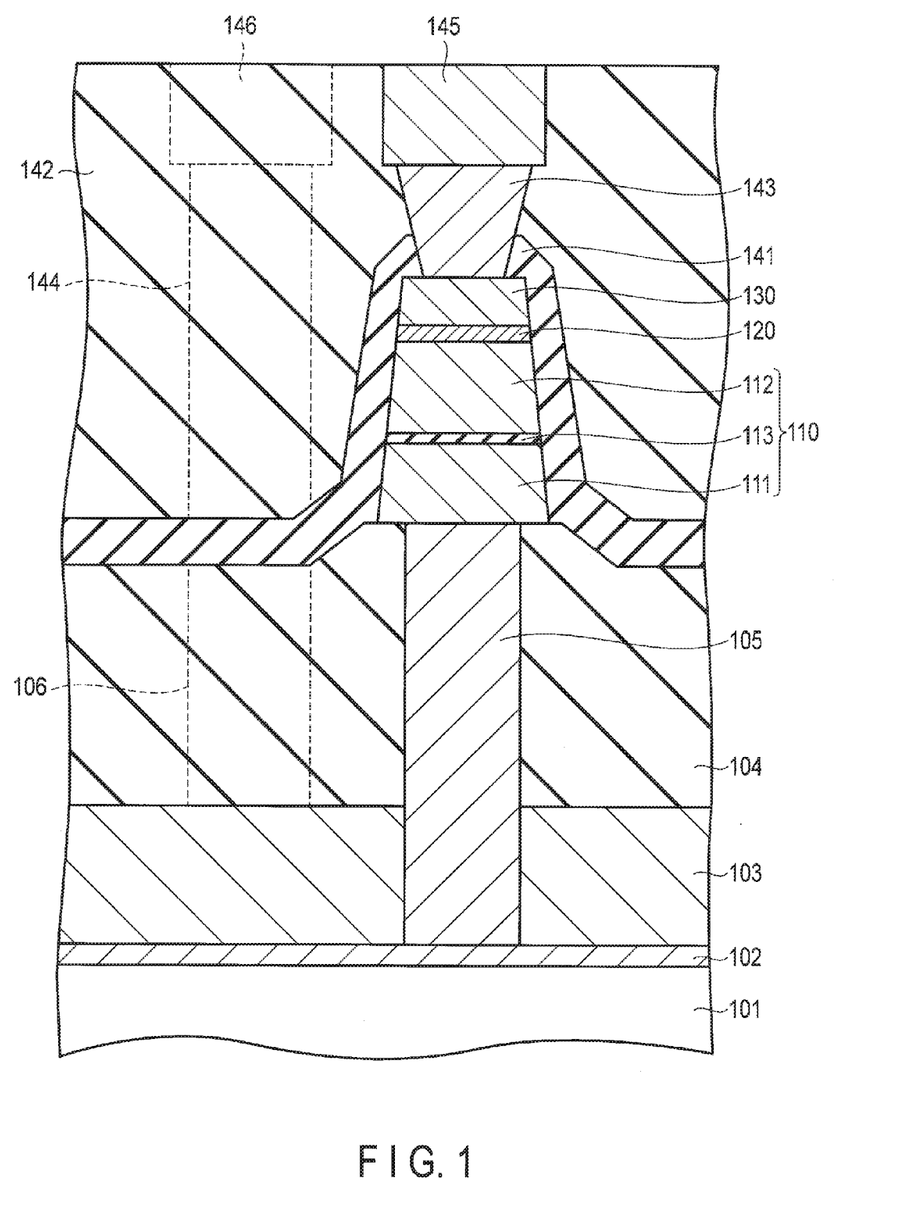
FIG. 1 is a cross-sectional view schematically showing a structure of a magnetic memory device of a first embodiment.

FIG. 1 is a cross-sectional view schematically showing a structure of a magnetic memory device (semiconductor integrated circuit device) of a first embodiment.

A MOS transistor which functions as a select transistor for selecting a magnetoresistive effect element is formed in a surface region of a semiconductor substrate 101. FIG. 1 shows source/drain regions 102 and a gate electrode (word line) 103 of the MOS transistor.

An interlayer insulating film 104 is formed on the semiconductor substrate 101 on which the MOS transistor is formed. Contact plugs 105 and 106 are provided in the interlayer insulating film 104. Contact plug 105 is connected to one of the source/drain regions 102 and contact plug 106 is connected to the other of the source/drain regions 102.

A spin transfer torque (STT) type magnetoresistive effect element 110 is provided on the interlayer insulating film 104. The magnetoresistive effect element 110 includes a first magnetic layer (storage layer) 111 having variable magnetization, a second magnetic layer (reference layer) 112 having fixed magnetization and a nonmagnetic layer (tunnel barrier layer) 113 provided between the first magnetic layer 111 and the second magnetic layer 112. The magnetoresistive effect element 110 is connected to contact plug 105. The magnetoresistive effect element is also called a magnetic tunnel junction (MTJ) element.

When the direction of magnetization of the storage layer 111 is parallel to that of the reference layer 112, the magnetoresistive effect element 110 shows a low-resistance state. When the direction of magnetization of the storage layer 111 is antiparallel to that of the reference layer 112, the magnetoresistive effect element 110 shows a high-resistance state. Therefore, the magnetoresistive effect element 110 can store binary information (0 or 1) in accordance with the resistance state (low-resistance state and high-resistance state). The resistance state (low-resistance state and high-resistance state) can be set in accordance with a direction of a write current passing through the magnetoresistive effect element 110.

A tungsten (W) layer 120 is formed on the magnetoresistive effect element 110. A cap layer (first layer) 130 is formed on the W layer 120. The cap layer 130 will be described later in detail.

The magnetoresistive effect element 110, the W layer 120 and the cap layer 130 are covered with a protective insulating film 141. An interlayer insulating film 142 is formed on the protective insulating film 141. Contact plugs 143 and 144 are provided in the interlayer insulating film 142. One end of contact plug 143 is connected to the cap layer 130 and the other end of contact plug 143 is connected to a bit line 145. One end of contact plug 144 is connected to contact plug 106 and the other end of contact plug 144 is connected to a source line 146.

Figure 2:
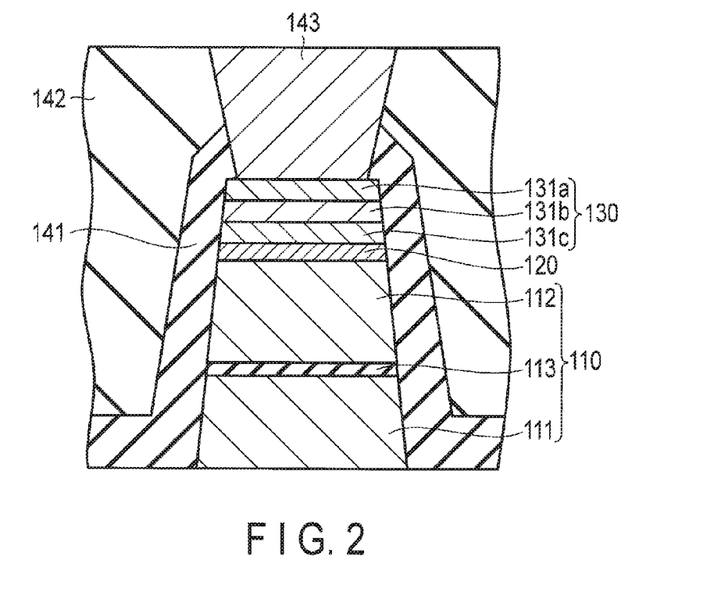
FIG. 2 is a cross-sectional view schematically showing a structure of a magnetoresistive effect element, a cap layer and the like of the magnetic memory device of the first embodiment.

FIG. 2 is a cross-sectional view schematically showing a structure of the magnetoresistive effect element 110, the cap layer 130 and the like of the present embodiment.

As shown in FIG. 2, the cap layer 130 is provided on the magnetoresistive effect element 110 with the tungsten (W) layer 120 between.

The cap layer (first layer) 130 includes an upper conductive layer 131a, a predetermined metal containing conductive layer 131b provided between the magnetoresistive effect element 110 and the upper conductive layer 131a, and a lower conductive layer 131c provided between the magnetoresistive effect element 110 and the predetermined metal containing conductive layer 131b.

The upper conductive layer 131a is formed of ruthenium (Ru). The lower conductive layer 131c is not limited, but is formed of ruthenium (Ru) in the present embodiment. The lower conductive layer 131c may be omitted.

The predetermined metal containing conductive layer 131b contains a predetermined metal selected from platinum (Pt), iridium (Ir), palladium (Pd) and gold (Au). More specifically, a Pt layer, an Ir layer, a Pd layer, an Au layer or an Ir oxide layer is used for the predetermined metal containing conductive layer 131b. These materials are superior in resistance to plasma gas, acid chemical solution and alkali chemical solution. Pt, Pd and Au are resistant to oxidizing. An oxide of Ir (Ir oxide) is conductive.

By thus providing the predetermined metal containing conductive layer 131b between the upper conductive layer 131a formed of Ru and the magnetoresistive effect element 110, the magnetoresistive effect element 110 can be prevented from being exposed during the manufacturing process as described below.

Figure 3:
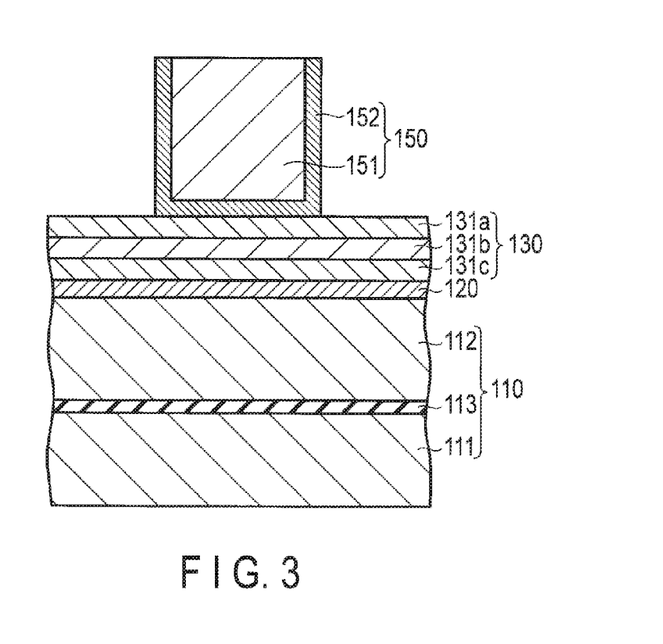
FIG. 3 is a cross-sectional view schematically showing part of a method of manufacturing the magnetic memory device of the first embodiment.
Figure 4:
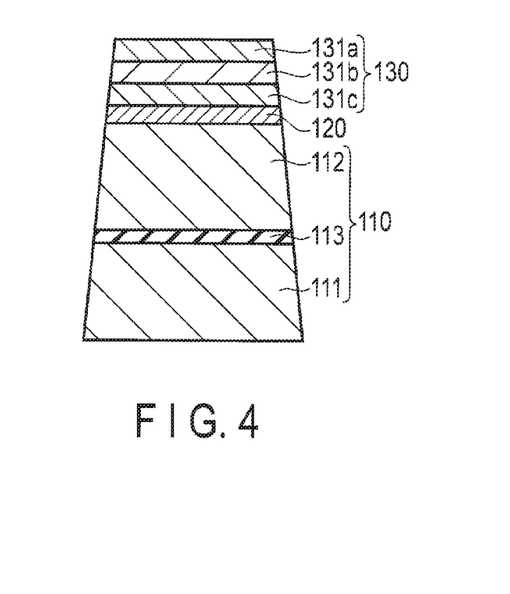
FIG. 4 is a cross-sectional view schematically showing part of the method of manufacturing the magnetic memory device of the first embodiment.
Figure 5:
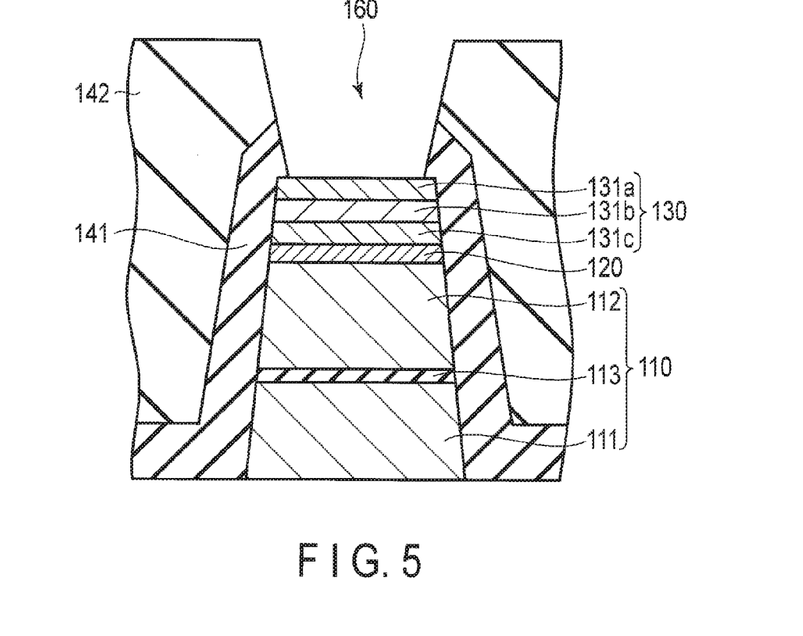
FIG. 5 is a cross-sectional view schematically showing part of the method of manufacturing the magnetic memory device of the first embodiment.

FIG. 3, FIG. 4 and FIG. 5 are cross-sectional views each schematically showing part of a method of manufacturing the magnetic memory device of the present embodiment.

First, as shown in FIG. 3, a magnetoresistive effect element layer 110, a tungsten (W) layer 120 and a cap layer 130 are sequentially formed on an underlying region (not shown) including a semiconductor substrate, a transistor and the like. After that, a hard mask 150 is formed on the cap layer 130. The hard mask 150 is formed of a tungsten (W) layer 151 and a titanium nitride (TiN) layer 152.

Next, as shown in FIG. 4, a pattern of the magnetoresistive effect element 110 is formed by etching the cap layer 130, the tungsten (W) layer 120 and the magnetoresistive effect element layer 110 by using the hard mask 150 as a mask. Ion beam etching (IBE) or reactive ion etching (RIE) is used for the etching. After the etching, the hard mask 150 is removed and the upper surface of the cap layer 130 is exposed.

Next, as shown in FIG. 5, a protective insulating film 141 which covers the magnetoresistive effect element 110, the tungsten (W) layer 120 and the cap layer 130 is formed. A silicon nitride film or an aluminum oxide film is used for the protective insulating film 141. An interlayer insulating film 142 which covers the protective insulating film 141 is further formed. A silicon oxide film or the like is used for the interlayer insulating film 142. After planarizing the interlayer insulating film 142, a contact hole 160 is formed in the protective insulating film 141 and the interlayer insulating film 142 by RIE using a resist pattern (not shown) as a mask. The upper surface of the cap layer 130 is thus exposed. After that, the resist pattern is removed by ashing using gaseous oxygen, and wet cleaning is further performed.

Then, a contact plug 143 is formed in the contact hole 160. For contact plug 143, a W/TiN film, a Cu/Ta film or the like is used. The structure shown in FIG. 1 and FIG. 2 can be achieved by further forming a bit line, a source line and the like.

Figure 6:
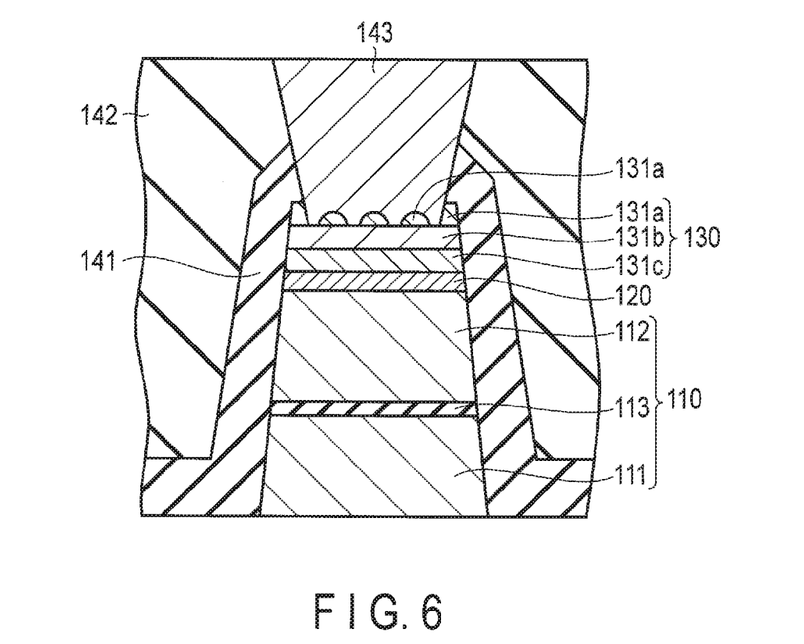
FIG. 6 is a cross-sectional view schematically showing a structure of a modified example of the magnetic memory device of the first embodiment.

In the present embodiment, the upper conductive layer 131a is basically formed on the entire upper surface of the predetermined metal containing conductive layer 131b as shown in FIG. 2. In the above manufacturing process, however, there is a possibility that Ru used for the upper conductive layer 131a is oxidized and part of the upper conductive layer 131a is removed when removing the resist pattern by ashing using gaseous oxygen. As a result, the upper conductive layer 131a may be formed on part of the upper surface of the predetermined metal containing conductive layer 131b as shown in FIG. 6. In such a case, if the predetermined metal containing conductive layer 131b is not provided under the upper conductive layer 131a, the magnetoresistive effect element 110 may be damaged by a chemical solution for wet cleaning when performing the wet cleaning after the ashing.

In the present embodiment, the predetermined metal containing conductive layer 131b superior in resistance to plasma gas, acid chemical solution and alkali chemical solution is provided between the magnetoresistive effect element 110 and the upper conductive layer 131a. Therefore, invasion of the chemical solution for wet cleaning can be avoided by the predetermined metal containing conductive layer 131b even if part of the upper conductive layer 131a is removed.

In the above manufacturing process, part of the hard mask 150 may be left on the cap layer 130 when forming a pattern of the magnetoresistive effect element 110, etc., by using the hard mask 150 as a mask. In such a case, W used for the hard mask 150 may be oxidized and a W oxide may be formed, which may increase contact resistance.

In the present embodiment, the predetermined metal containing conductive layer 131b is provided between the magnetoresistive effect element 110 and the upper conductive layer 131a. Therefore, the hard mask 150 can be completely removed. If the hard mask 150 is removed and the upper conductive layer (Ru layer) 131a is exposed during patterning (etching), part of the upper conductive layer 131a is also etched. Therefore, the hard mask 150 should preferably be removed completely right before the end of the patterning (etching). However, such etching control is difficult and part of the hard mask 150 may be left. In the present embodiment, the predetermined metal containing conductive layer 131b is provided under the upper conductive layer 131a. Accordingly, no problem occurs if the upper conductive layer 131a is somewhat etched. Therefore, the hard mask 150 can be reliably removed and the above problem can be avoided.

As described above, in the present embodiment, the predetermined metal containing conductive layer 131b is provided between the magnetoresistive effect element 110 and the upper conductive layer 131a. Therefore, the magnetoresistive effect element 110 can be reliably protected by the predetermined metal containing conductive layer 131b and a magnetic memory device equipped with a sufficiently reliable cap layer can be achieved.

Pt, Ir, Pd and Au contained in the predetermined metal containing conductive layer 131b are precious metals and are expensive. In the present embodiment, the predetermined metal containing conductive layer 131b is used for part of the cap layer. Therefore, the material cost can be reduced.

Embodiment 2

Next, the second embodiment is described. Since the basic structure and manufacturing method are similar to those of the first embodiment, the description of the matters described in the first embodiment is omitted.

Figure 7:
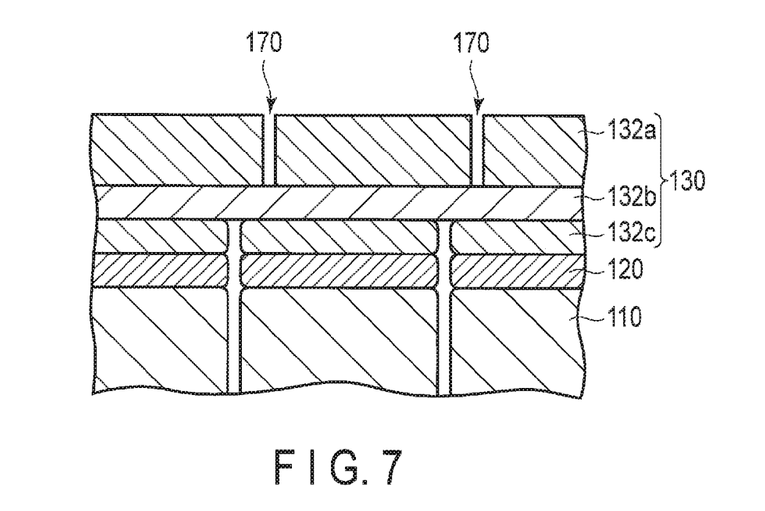
FIG. 7 is a cross-sectional view schematically and mainly showing a structure of a cap layer of a magnetic memory device of a second embodiment.

FIG. 7 is a cross-sectional view schematically and mainly showing a structure of a cap layer of a magnetic memory device of the present embodiment.

Similarly to the first embodiment, a cap layer 130 is provided on a magnetoresistive effect element 110 with a tungsten (W) layer 120 between.

In the present embodiment, the cap layer (first layer) 130 includes a first crystal conductive layer 132a having a crystal structure, an amorphous conductive layer 132b provided between the magnetoresistive effect element 110 and the first crystal conductive layer 132a and having an amorphous structure, and a second crystal conductive layer 132c having a crystal structure and provided between the magnetoresistive effect element 110 and the amorphous conductive layer 132b.

For example, Ru can be used for crystal conductive layers 132a and 132c. The material of the predetermined metal containing conductive layer 131b described in the first embodiment (i.e., Pt, Ir, Pd, Au or Ir oxide) may also be used for crystal conductive layer 132a and 132c. W or Ta may also be used.

The amorphous conductive layer 132b is formed of an amorphous metal described below.

As an amorphous metal for the amorphous conductive layer 132b, an amorphous alloy formed of a transition metal and a semimetal can be used. In this case, hafnium (Hf), iron (Fe), palladium (Pd), molybdenum (Mo), zirconium (Zr) or tantalum (Ta) is used as the transition metal. As the semimetal, phosphorus (P), boron (B), carbon (C), silicon (Si) or germanium (Ge) is used. For example, an amorphous alloy formed of about 80 at % transition metal and about 20 at % semimetal can be used. HfB and FeB can be typically used as the amorphous alloy.

In addition, an amorphous alloy formed of transition metals can also be used as the amorphous metal for the amorphous conductive layer 132b. In this case, a Cu—Zr alloy, an Fe—Zr alloy, an Ni—Nb alloy, a Ti—Ni alloy or the like can be used as the amorphous alloy.

In the present embodiment, damage to the magnetoresistive effect element 110 caused by a chemical solution and etching gas can be reduced by providing the amorphous conductive layer 132b between the magnetoresistive effect element 110 and crystal conductive layer 132a. This point is hereinafter described in detail.

Since an Ru layer or the like used for the cap layer 130 has a crystal structure, the magnetoresistive effect element 110 may be damaged by a chemical solution and etching gas invading through the crystal grain boundary 170. In the present embodiment, the amorphous conductive layer 132b without a crystal grain boundary is provided between the magnetoresistive effect element 110 and crystal conductive layer 132a, invasion of the chemical solution and etching gas can be avoided by the amorphous conductive layer 132b.

Therefore, according to the present embodiment, the magnetoresistive effect element 110 can be reliably protected by the amorphous conductive layer 132b and a magnetic memory device equipped with a sufficiently reliable cap layer can be achieved.

Figure 8:
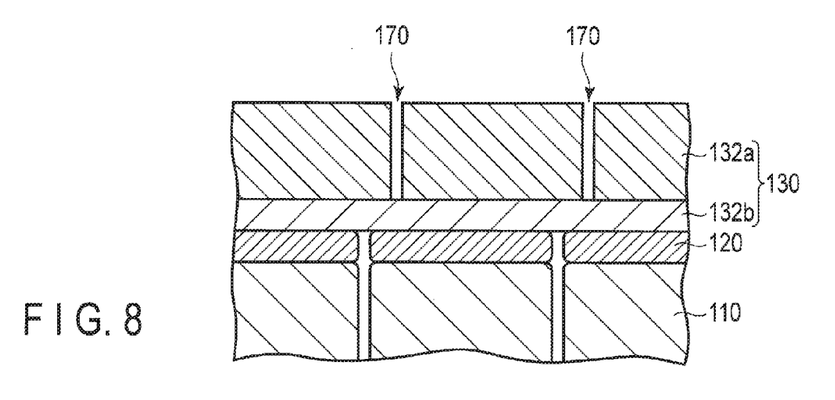
FIG. 8 is a cross-sectional view schematically and mainly showing a structure of a cap layer of a magnetic memory device of a modified example of the second embodiment.

FIG. 8 is a cross-sectional view schematically and mainly showing a structure of a cap layer of a magnetic memory device of a modified example of the present embodiment.

Crystal conductive layer 132c is provided between the magnetoresistive effect element 110 and the amorphous conductive layer 132b in the above-described embodiment, but crystal conductive layer 132c is not provided in the modified example.

The same effect as the above-described embodiment can be achieved even by using the structure of the modified example.

Embodiment 3

Next, the third embodiment is described. Since the basic structure and manufacturing method are similar to those of the first and second embodiments, the description of the matters described in the first and second embodiments is omitted.

Figure 9:
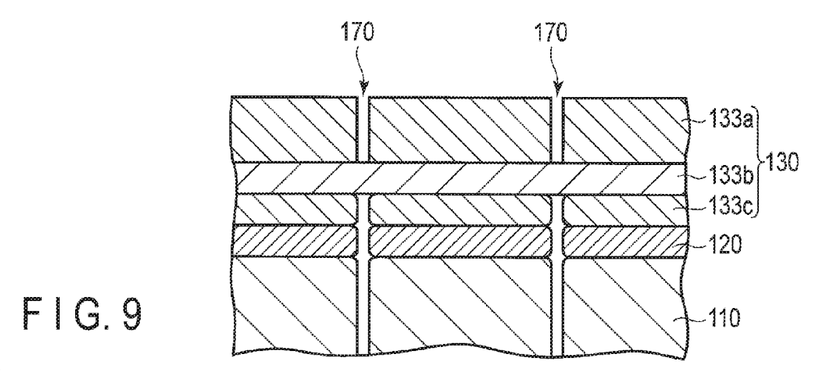
FIG. 9 is a cross-sectional view schematically and mainly showing a structure of a cap layer of a magnetic memory device of a third embodiment.

FIG. 9 is a cross-sectional view schematically and mainly showing a structure of a cap layer of a magnetic memory device of the present embodiment.

Similarly to the first and second embodiments, a cap layer 130 is provided on a magnetoresistive effect element 110 with a tungsten (W) layer 120 between.

In the present embodiment, the cap layer 130 (first layer) includes a first crystal conductive layer 133a having a crystal structure, an amorphous conductive layer 133b having an amorphous structure, and a second crystal conductive layer 133c having a crystal structure. In the example shown in FIG. 9, the amorphous conductive layer 133b is provided between the magnetoresistive effect element 110 and the first crystal conductive layer 133a, and the second crystal conductive layer 133c is provided between the magnetoresistive effect element 110 and the amorphous conductive layer 133b.

The amorphous conductive layer 133b contains a main element identical to that contained in crystal conductive layers 133a and 133c. The main element is selected from ruthenium (Ru), platinum (Pt), iridium (Ir), palladium (Pd), gold (Au), tungsten (W) and tantalum (Ta).

Crystal conductive layers 133a and 133c are formed mostly of the above element. More specifically, crystal conductive layers 133a and 133c are formed of an Ru layer, a Pt layer, an Ir layer, a Pd layer, an Au layer, a W layer, a Ta layer or an Ir oxide layer.

The amorphous conductive layer 133b is formed by forming a crystal conductive layer on the W layer 120 and then introducing a predetermined ion into part of the crystal conductive layer by ion implantation or IBE. That is, the crystal structure of the crystal conductive layer is collapsed by energy of the ion implantation or IBE and the amorphous conductive layer 133b without a crystal grain boundary can be achieved. Therefore, a basic constituent material of the amorphous conductive layer 133b is the same as that of crystal conductive layers 133a and 133c. An element (predetermined ion) used for the ion implantation or IBE is generally a noble gas element such as argon (Ar). Therefore, the amorphous conductive layer 133b also contains the noble gas element.

In the present embodiment, the amorphous conductive layer 133b without a crystal grain boundary is provided as part of the cap layer 130. Accordingly, invasion of the chemical solution and etching gas from the crystal grain boundary 170 can be avoided by the amorphous conductive layer 133b.

Therefore, according to the present embodiment, the magnetoresistive effect element 110 can be reliably protected by the amorphous conductive layer 133b and a magnetic memory device equipped with a sufficiently reliable cap layer can be achieved.

Figure 10:
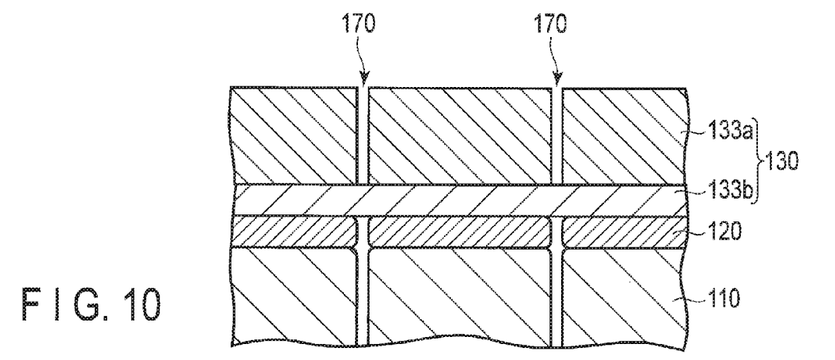
FIG. 10 is a cross-sectional view schematically and mainly showing a structure of a cap layer of a magnetic memory device of a first modified example of the third embodiment.

FIG. 10 is a cross-sectional view schematically and mainly showing a structure of a cap layer of a magnetic memory device of the first modified example of the present embodiment.

Crystal conductive layer 133c is provided between the magnetoresistive effect element 110 and the amorphous conductive layer 133b in the above-described embodiment, but crystal conductive layer 133c is not provided in the modified example.

The same effect as the above-described embodiment can be achieved even by using the structure of the first modified example.

Figure 11:
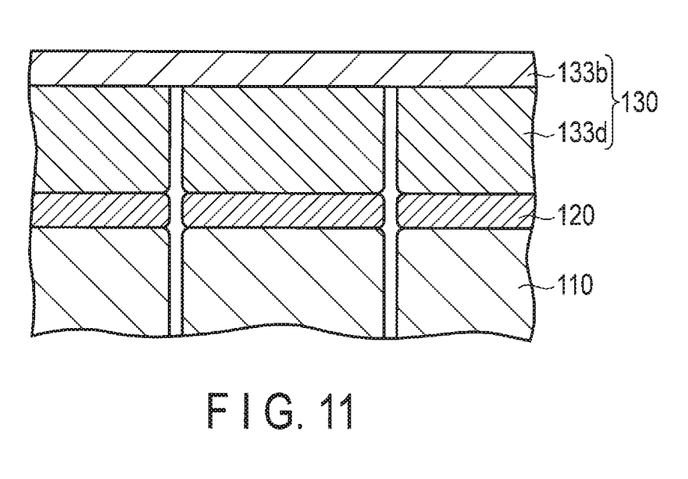
FIG. 11 is a cross-sectional view schematically and mainly showing a structure of a cap layer of a magnetic memory device of a second modified example of the third embodiment.

FIG. 11 is a cross-sectional view schematically and mainly showing a structure of a cap layer of a magnetic memory device of the second modified example of the present embodiment.

In the modified example, crystal conductive layer 133d is provided between the magnetoresistive effect element 110 and the amorphous conductive layer 133b. That is, the amorphous conductive layer 133b is provided as the uppermost layer of the cap layer 130.

The same effect as the above-described embodiment can be achieved even by using the structure of the second modified example.

Embodiment 4

Next, the fourth embodiment is described. The structure of the present embodiment is based on a combination of the structure of the first embodiment and the structure of the second embodiment, or a combination of the structure of the first embodiment and the structure of the third embodiment. Since the basic structure and manufacturing method are similar to those of the first, second and third embodiments, the description of the matters described in the first, second and third embodiments is omitted.

Figure 12:
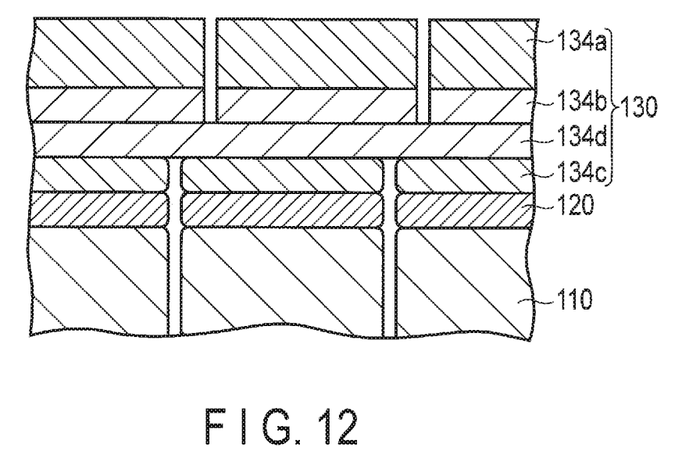
FIG. 12 is a cross-sectional view schematically and mainly showing a structure of a cap layer of a magnetic memory device of a fourth embodiment.

FIG. 12 is a cross-sectional view schematically and mainly showing a structure of a cap layer of a magnetic memory device of the present embodiment.

Similarly to the first, second and third embodiments, a cap layer 130 is provided on a magnetoresistive effect element 110 with a tungsten (W) layer 120 between.

In the present embodiment, the cap layer 130 includes an upper conductive layer 134a, a predetermined metal containing conductive layer 134b, a lower conductive layer 134c and an amorphous conductive layer 134d. The upper conductive layer 134a, the predetermined metal containing conductive layer 134b and the lower conductive layer 134c correspond to the upper conductive layer 131a, the predetermined metal containing conductive layer 131b and the lower conductive layer 131c of the first embodiment, respectively. The amorphous conductive layer 134d corresponds to the amorphous conductive layer 132b of the second embodiment or the amorphous conductive layer 133b of the third embodiment. In the example shown in FIG. 12, the amorphous conductive layer 134d is provided between the predetermined metal containing conductive layer 134b and the lower conductive layer 134c. However, the amorphous conductive layer 134d may be provided in an arbitrary position in the cap layer 130.

According to the present embodiment, the same effect as the first, second and third embodiments can be achieved and a magnetic memory device equipped with a sufficiently reliable cap layer can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
a magnetoresistive effect element; and
a first layer provided on the magnetoresistive effect element,
wherein the first layer comprises:
a first crystal conductive layer having a crystal structure;
an amorphous conductive layer provided between the magnetoresistive effect element and the first crystal conductive layer and having an amorphous structure; and
a second crystal conductive layer having a crystal structure and provided between the magnetoresistive effect element and the amorphous conductive layer.

2. The device of claim 1, wherein the amorphous conductive layer is formed of an amorphous alloy of a transition metal and a semimetal or an amorphous alloy of transition metals.

3. The device of claim 1, wherein the magnetoresistive effect element comprises a first magnetic layer having variable magnetization, a second magnetic layer having fixed magnetization, and a nonmagnetic layer provided between the first magnetic layer and the second magnetic layer.

4. A magnetic memory device comprising:
a magnetoresistive effect element; and
a first layer provided on the magnetoresistive effect element,
wherein the first layer comprises:
a first crystal conductive layer having a crystal structure; and
an amorphous conductive layer which is a nonmagnetic layer, said amorphous conductive layer containing a main element identical to a main element contained in the first crystal conductive layer and having an amorphous structure,
wherein the amorphous conductive layer is provided between the magnetoresistive effect element and the first crystal conductive layer, and
wherein the first layer further comprises a second crystal conductive layer having a crystal structure and provided between the magnetoresistive effect element and the amorphous conductive layer.

5. The device of claim 4, wherein the main element is selected from Ru, Pt, Ir, Pd, Au, W and Ta.

6. The device of claim 4, wherein the amorphous conductive layer contains a noble gas element.

7. The device of claim 4, wherein the magnetoresistive effect element comprises a first magnetic layer having variable magnetization, a second magnetic layer having fixed magnetization, and a nonmagnetic layer provided between the first magnetic layer and the second magnetic layer.

* * * * *